United States Patent
Kanemura et al.

(10) Patent No.: US 11,114,297 B2
(45) Date of Patent: Sep. 7, 2021

(54) METHOD FOR FORMING SEMICONDUCTOR FILM AND FILM FORMING DEVICE

(71) Applicant: TOKYO ELECTRON LIMITED, Tokyo (JP)

(72) Inventors: Rui Kanemura, Nirasaki (JP); Keita Kumagai, Nirasaki (JP); Keisuke Fujita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 4 days.

(21) Appl. No.: 16/693,748

(22) Filed: Nov. 25, 2019

(65) Prior Publication Data

US 2020/0168455 A1   May 28, 2020

(30) Foreign Application Priority Data

Nov. 26, 2018   (JP) ............................... JP2018-220608

(51) Int. Cl.
 *H01L 21/02*   (2006.01)
 *H01L 21/66*   (2006.01)
 *C23C 16/56*   (2006.01)

(52) U.S. Cl.
 CPC ........ *H01L 21/02667* (2013.01); *C23C 16/56* (2013.01); *H01L 21/02595* (2013.01); *H01L 22/12* (2013.01)

(58) Field of Classification Search
 CPC combination set(s) only.
 See application file for complete search history.

(56) References Cited

U.S. PATENT DOCUMENTS

| 7,050,878 B2 * | 5/2006 | Yamazaki | B23K 26/04 700/121 |
| 7,132,375 B2 * | 11/2006 | Yamazaki | H01L 21/2026 438/795 |
| 2003/0013280 A1 * | 1/2003 | Yamanaka | H01L 21/02535 438/487 |
| 2006/0252235 A1 * | 11/2006 | Aberle | H01L 21/02667 438/478 |
| 2011/0089429 A1 * | 4/2011 | Prabhakar | H01L 31/1872 257/75 |
| 2012/0248455 A1 * | 10/2012 | Van Gestel | H01L 21/02672 257/75 |
| 2013/0084693 A1 * | 4/2013 | Kakimoto | C23C 16/24 438/482 |

(Continued)

FOREIGN PATENT DOCUMENTS

JP   2009-99582 A   5/2009

*Primary Examiner* — Mamadou L Diallo
(74) *Attorney, Agent, or Firm* — Nath, Goldberg & Meyer; Jerald L. Meyer; Tanya E. Harkins

(57) ABSTRACT

According to one embodiment of the present disclosure, a method for forming a crystallized semiconductor film having a specific grain size on a substrate includes: forming a seed layer on the substrate accommodated in a processing container; vacuuming an interior of the processing container to a medium vacuum or less in a state in which the substrate, on which the seed layer is formed, is accommodated in the processing container; forming an amorphous semiconductor film on the seed layer after vacuuming the interior of the processing container; and crystallizing the amorphous semiconductor film by heat processing.

10 Claims, 7 Drawing Sheets

(56) References Cited

U.S. PATENT DOCUMENTS

2014/0159042 A1* 6/2014 Hutchings ......... H01L 31/03685
  257/52
2014/0295579 A1* 10/2014 Guo ....................... H01L 43/12
  438/3
2017/0301817 A1* 10/2017 Pearson ............ H01L 21/02532
2020/0328081 A1* 10/2020 McMahon .............. C30B 33/02

* cited by examiner

METHOD FOR FORMING SEMICONDUCTOR FILM AND FILM FORMING DEVICE

CROSS-REFERENCE TO RELATED APPLICATION

This application is based upon and claims the benefit of priority from Japanese Patent Application No. 2018-220608, filed on Nov. 26, 2018, the entire contents of which are incorporated herein by reference.

TECHNICAL FIELD

The present disclosure relates to a method for forming a semiconductor film and a film forming device.

BACKGROUND

A technology of controlling the grain size of a poly silicon film by adding impurities, such as carbon, to an amorphous silicon film and adjusting the amount of the added impurities when the poly silicon film is formed by crystallizing the amorphous silicon film by heat processing is known (see Patent Document 1).

PRIOR ART TECHNICAL DOCUMENTS

Patent Document

Patent Document 1: Japanese Patent Application Publication No. 2009-99582

SUMMARY

According to one embodiment of the present disclosure, there is provided a method for forming a crystallized semiconductor film having a specific grain size on a substrate comprising: forming a seed layer on the substrate accommodated in a processing container; vacuuming an interior of the processing container to a medium vacuum or less in a state in which the substrate, on which the seed layer is formed, is accommodated in the processing container; forming an amorphous semiconductor film on the seed layer after vacuuming the interior of the processing container; and crystallizing the amorphous semiconductor film by heat processing.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
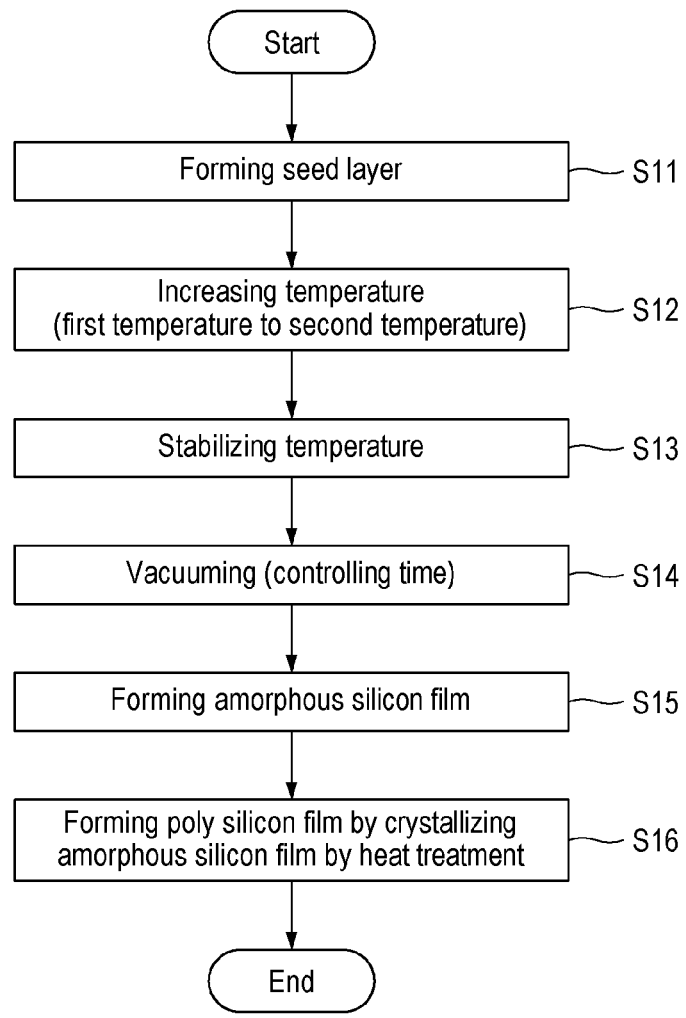
FIG. 1 is a flowchart illustrating an example of a method for forming a poly silicon film of a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. The same or corresponding reference numerals are given to the same or corresponding members or parts throughout all the accompanying drawings, and a repeated description thereof will be omitted.

Crystallization silicon films (poly silicon films) obtained by crystallizing amorphous silicon films have been used for various purposes. Various purposes may include, for example, thin film transistors (TFTs) for driving pixels of flat panel displays (FPDs), channels of memory cell transistors of nonvolatile semiconductor memory devices, and gate electrodes of MOSFETs.

However, poly silicon films of large grain sizes or poly silicon films of small grain sizes may be required according to their purposes. Further, this is the same for other crystallized semiconductor films as well as poly silicon films. Accordingly, a method for forming a semiconductor film and a film forming device, by which the grain size of a crystallized semiconductor film is controlled, will be described below.

[Method for Forming Semiconductor Film]

First Embodiment

Figure 2:
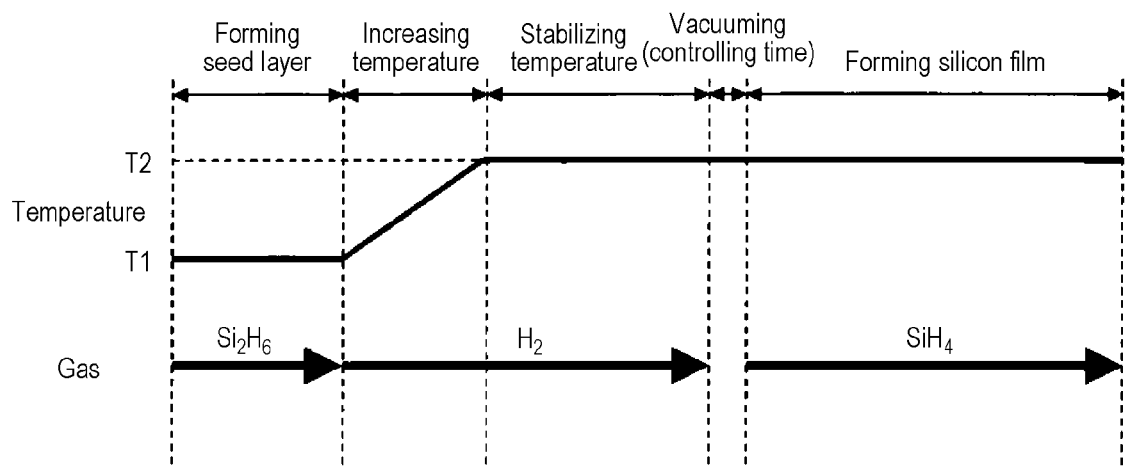
FIG. 2 is a view illustrating an example of the temperature and the gas supply states of processes of FIG. 1.

As a method for forming a semiconductor film of a first embodiment, a case of forming a poly silicon film will be described as an example. FIG. 1 is a flowchart illustrating an example of the method for forming a poly silicon film of the first embodiment. FIG. 2 is a view illustrating an example of the temperature and the gas supply states of processes of FIG. 1.

First, a seed layer forming process of forming a seed layer on a substrate, which is accommodated in an interior of a processing container, is performed by supplying a silicon (Si) raw material gas for the seed layer to the substrate (step S11). In an embodiment, for example, by a chemical vapor deposition (CVD) method, a seed layer is formed on the substrate by supplying the silicon raw material gas for the seed layer in a state in which the substrate is heated to a first temperature T1. For example, a semiconductor substrate, such as a silicon substrate, may be used as the substrate.

Gas including at least any one of a higher-order silane-based gas including two or more Si atoms in one molecule, an amino silane-based gas, a mixture gas of a hydrogenated silane gas and a halogen-containing silicon gas may be properly used as the silicon raw material gas for the seed layer. By forming the seed layer, the roughness of the silicon film formed on the seed layer can be reduced. Further, the seed layer may be a single layer film formed by using any of the gases or a laminated film formed by combining the gases. Further, when an amino silane-based compound is used as the silicon raw material gas for the seed layer, a temperature at which thermal decomposition does not occur is preferable.

The higher-order silane-based gas may include, for example, $Si_2H_6$, $Si_3H_8$, and Si4H10. The amino silane-based gas may include, for example, diisopropylamino silane (DIPAS), trisdimethylamino silane (3DMAS), and bis(tertiarybutylamino) silane (BTBAS). The hydrogenated silane gas may include, for example, $SiH_4$, $Si_2H_6$, and $Si_3H_8$. The halogen-containing silicon gas may include, for example, a fluorine-containing silicon gas such as $SiH_4$, $SiHF_3$, $SiH_2F_2$, and $SiH_3F$, a chloride-containing silicon gas such as $SiCl_4$, $SiHCl_3$, $SiH_2Cl_2$(DCS), and $SiH_3Cl$, and a bromine-containing silicon gas such as $SiBr_4$, $SiHBr_3$, $SiH_2Br_2$, and $SiH_3Br$.

In an embodiment, as illustrated in FIG. 2, $Si_2H_6$ is used as the silicon raw material gas for the seed layer. The thickness of the seed layer may be, for example, 1 to 2 nm. For example, ranges of a processing temperature of 350 to 430 degrees C. and a pressure of 6.5 to 667 Pa may be used as a process condition in the seed layer forming process.

Subsequently, a temperature increasing process of increasing the temperature of the substrate from a temperature (a first temperature T1) of the seed layer forming process in a hydrogen atmosphere to a temperature (a second temperature T2) of a silicon film forming process, which will be described below, is performed (step S12). In the temperature increasing process, for example, the pressure of the interior of the processing container is maintained at a low vacuum, for example, of about 90 Torr ($1.2 \times 10^4$ Pa) by supplying hydrogen ($H_2$) gas to the interior of the processing container, in which the substrate is accommodated. Further, the term "low vacuum" refers to a state of a pressure of $10^5$ Pa to $10^2$ Pa.

Subsequently, a stabilization process of stabilizing the temperature of the substrate to the second temperature T2 in the hydrogen atmosphere is performed (step S13). In the stabilization process, for example, the pressure of the interior of the processing container is maintained at a low vacuum, for example, of about 90 Torr ($1.2 \times 10^4$ Pa) by supplying hydrogen gas to the interior of the processing container, in which the substrate is accommodated.

Subsequently, a vacuuming process of vacuuming the interior of the processing container to a medium vacuum or less is performed in a state in which the substrate, on which the seed layer is formed, is accommodated in the processing container (step S14). Further, the term "medium vacuum" refers to a state of a pressure of $10^2$ Pa to $10^{-1}$ Pa. In the vacuuming process, in a state in which the temperature of the interior of the processing container is maintained at the second temperature T2, the gas of the interior of the processing container is exhausted for a time period associated with a specific grain size. The time period according to the specific grain size, for example, is selected on the basis of relation information, such as a table or a formula, which represents a relationship between a vacuuming time period and the grain size. The relation information is obtained by a preliminary experiment and the like. The vacuuming process may be performed while gas is not supplied to the interior of the processing container, and may be performed while a fine amount of gas, for example, an inert gas, such as nitrogen or argon, or hydrogen is supplied to the interior of the processing container. Further, the vacuuming process may be performed between the temperature increasing process and the silicon film forming process, and, for example, may be performed between the temperature increasing process and the stabilization process, and it may be performed during the stabilization process. However, it is preferable that the vacuuming process is performed after the stabilization process in an aspect of enhancing productivity by shortening the switching time and the vacuuming time period of the gas.

Subsequently, the silicon film forming process of forming an amorphous silicon film, which is an amorphous semiconductor film, on the seed layer by supplying a silicon raw material gas to the substrate accommodated in the interior of the processing container is performed (step S15). In an embodiment, the amorphous silicon film is formed on the seed layer by supplying the silicon raw material gas in a state in which the substrate is heated to the second temperature T2, for example, by a CVD method. The amorphous silicon film may be a non-doped silicon film or may be a silicon film doped with impurities. For example, the impurities may include boron B, phosphorus P, arsenic As, oxygen O, and carbon C.

Any silicon raw material gas that can be applicable to the CVD method will be sufficient, and for example, gas including at least any one of a hydrogenated silane gas, a halogen-containing silicon gas, and an amino silane-based gas may be properly used.

The hydrogenated silane gas may include, for example, $SiH_4$, $Si_2H_6$, and $Si_3H_8$. The halogen-containing silicon gas may include, for example, a fluorine-containing silicon gas such as $SiF_4$, $SiHF_3$, $SiH_2F_2$, and $SiH_3F$, a chloride-containing silicon gas such as $SiCl_4$, $SiHCl_3$, $SiH_2Cl_2$(DCS), and $SiH_3Cl$, and a bromine-containing silicon gas such as $SiBr_4$, $SiHBr_3$, $SiH_2Br_2$, and $SiH_3Br$. The amino silane-based gas may include, for example, diisopropylamino silane (DIPAS), trisdimethylamino silane (3DMAS), and bis(tertiarybutylamino) silane (BTBAS). Further, the impurity-containing gas when the impurities are doped may include, for example, $B_2H_6$, $BCl_3$, $PH_3$, and $AsH_3$.

For example, ranges of a processing temperature of 430 to 550 degrees C. and a pressure of 6.5 to 667 Pa may be used as an example of a process condition in the silicon layer forming process.

Subsequently, a crystallization process of forming a poly silicon film by crystallizing the amorphous silicon film by heat processing is performed (step S16). For example, ranges of a processing temperature of 550 to 900 degrees C. and a pressure of 6.5 to $10^5$ Pa may be used as an example of a process condition in the crystallization process.

Through the above processes (steps S11 to S16), a poly silicon film, the grain size of which is controlled, may be formed on the substrate.

Figure 3:
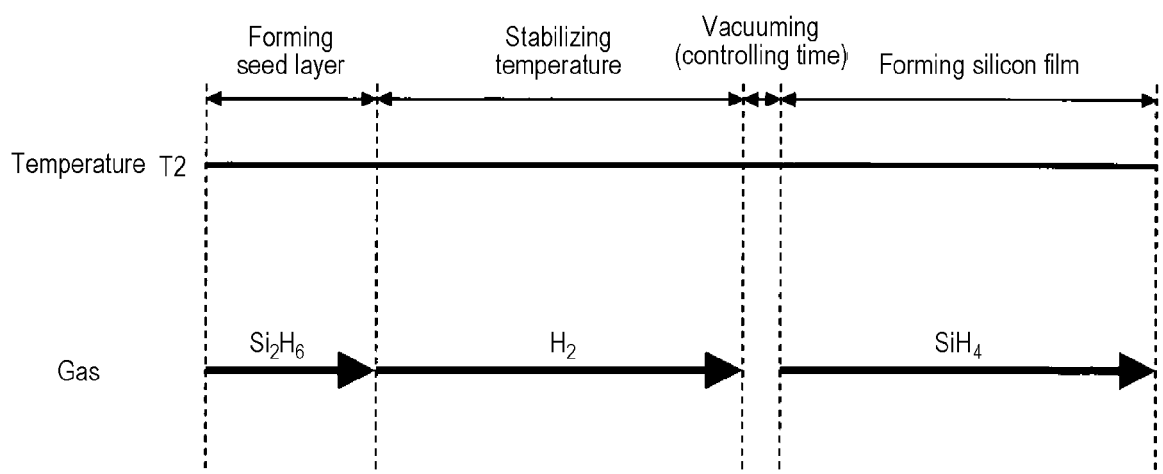
FIG. 3 is a view illustrating a modification of the method for forming a poly silicon film of the first embodiment.

Further, it has been described in the above example that the seed layer forming process and the silicon film forming process are executed at different temperatures, but the present disclosure is not limited thereto. For example, as illustrated in FIG. 3, the seed layer forming process and the silicon film forming process may be executed at the same temperature (for example, the second temperature T2). In this case, the temperature increasing process may be omitted. Further, the stabilization process in addition to the temperature increasing process may be omitted. Further, FIG. 3 is a view illustrating a modification of the method for forming a poly silicon film of the first embodiment.

Next, the reason that the grain size of the poly silicon film can be controlled through the method for forming the poly silicon film will be described.

First, in the seed layer forming process, the seed layer including hydrogen is formed. In the temperature increasing process and the temperature stabilizing process, in order to stabilize the temperature of the substrate by heating the substrate in the hydrogen atmosphere, desorption of hydrogen is suppressed even when the temperature of the seed layer becomes not less than a temperature at which hydrogen is desorbed from the interior of the film. In the vacuuming process, in order to vacuum the interior of the processing container to a medium vacuum or less, crystal nuclei of Si is formed in the seed layer by cutting silicon-hydrogen (Si—H) bonds of the seed layer. Then, because a larger number of Si—H bonds are cut as the period of time for the vacuuming process increases, the density of the crystal nuclei increases. In the silicon film forming process, an amorphous silicon film is formed on the seed layer, in which the crystal nuclei of Si are formed. In the crystallization process, grains grow while the crystal nuclei formed in the seed layer are taken as base points, by heat-processing the amorphous silicon film. Accordingly, as the density of the crystal nuclei increases, the grain size decreases. That is, the grain size decreases if the period of time for the vacuuming process increases, and the grain size increases if the period of time for the vacuuming process decreases.

In this manner, the method for forming a semiconductor film according to an embodiment includes a vacuuming process between the seed layer forming process and the silicon film forming process. Accordingly, the grain size of the poly silicon film can be controlled by controlling the period of time for the vacuuming process.

Second Embodiment

Figure 4:
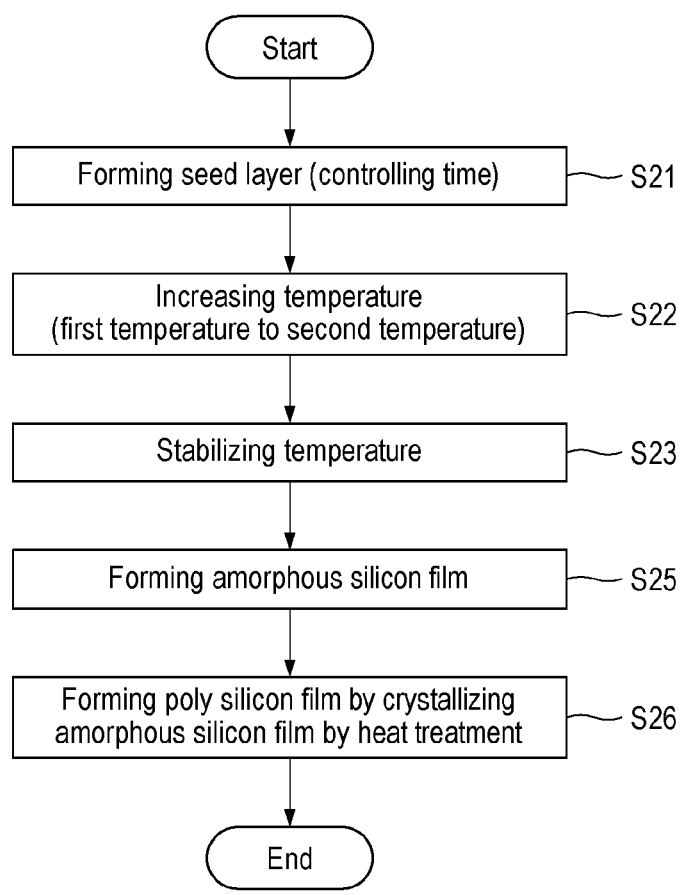
FIG. 4 is a flowchart illustrating an example of a method for forming a poly silicon film of a second embodiment.
Figure 5:
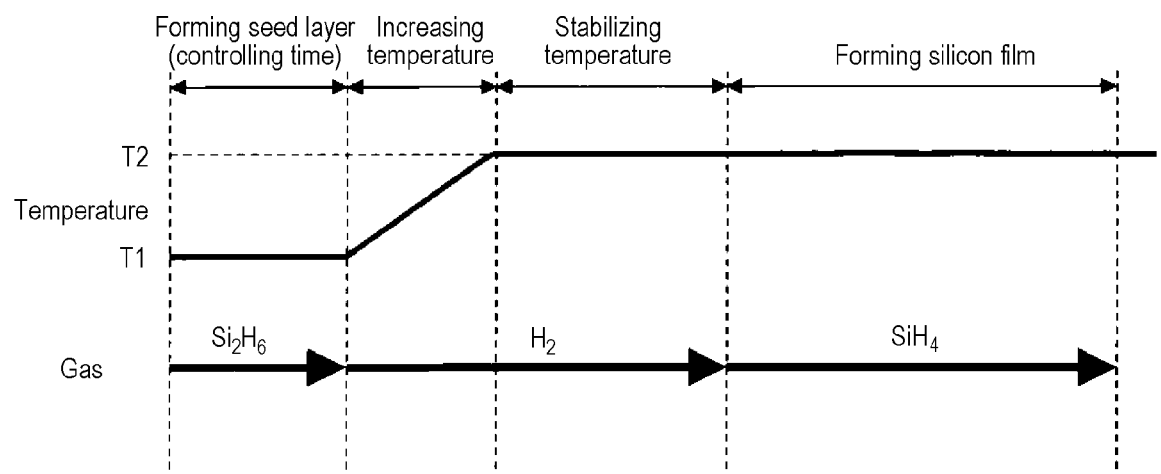
FIG. 5 is a view illustrating an example of the temperature and the gas supply states of processes of FIG. 4.

Next, as a method for forming a semiconductor film of a second embodiment, a case of forming a poly silicon film will be described as an example. FIG. 4 is a flowchart illustrating an example of the method for forming a poly silicon film of the second embodiment. FIG. 5 is a view illustrating an example of the temperature and the gas supply states of processes of FIG. 4.

First, a seed layer forming process of forming a seed layer on a substrate, which is accommodated in the interior of a processing container, is performed by supplying a silicon raw material gas for the seed layer to the substrate for a period of time according to a desired grain size (step S21). The period of time according to the desired grain size is selected, for example, on the basis of relation information, such as a table or a formula, which represents a relationship between a period of time for the seed layer forming process and the grain size. The relation information is obtained by a preliminary experiment and the like. The substrate and the silicon raw material gas for the seed layer may be used in the described seed layer forming process (step S11) as the substrate and the silicon raw material gas for the seed layer, respectively. In an embodiment, as illustrated in FIG. 5, $Si_2H_6$ is used as the silicon raw material gas for the seed layer. The thickness of the seed layer, for example, may be 2 nm or less. For example, ranges of a processing temperature of 350 to 430 degrees C., a pressure of 6.5 to 667 Pa, and a processing time period of 5 to 360 minutes, may be used as a process condition in the seed layer forming process. When an amino silane-based compound is used as the silicon raw material gas for the seed layer, a temperature at which thermal decomposition does not occur is preferable.

Subsequently, a temperature increasing process of increasing the temperature of the substrate from a temperature (a first temperature T1) of the seed layer forming process in a hydrogen atmosphere to a temperature (a second temperature T2) of a silicon film forming process, which will be described below, is performed (step S22). The temperature increasing process (step S22) may be the same as the above-described temperature increasing process (step S12).

Subsequently, a stabilization process of stabilizing the temperature of the substrate to the second temperature T2 in the hydrogen atmosphere is performed (step S23). The stabilization process (step S23) may be the same as the above-described stabilization process (step S13).

Subsequently, the silicon film forming process of forming an amorphous silicon film on the seed layer by supplying a silicon raw material gas to the substrate accommodated in the interior of the processing container is performed (step S25). The silicon film forming process (step S25) may be the same as the above-described silicon film forming process (step S15).

Subsequently, a crystallization process of forming a poly silicon film by crystallizing the amorphous silicon film by heat processing is performed (step S26). The crystallization process (step S26) may be the same as the above-described crystallization process (step S16).

Through the above processes (steps S21, S22, S23, S25, and S26), a poly silicon film, the grain size of which is controlled, may be formed on the substrate.

Figure 6:
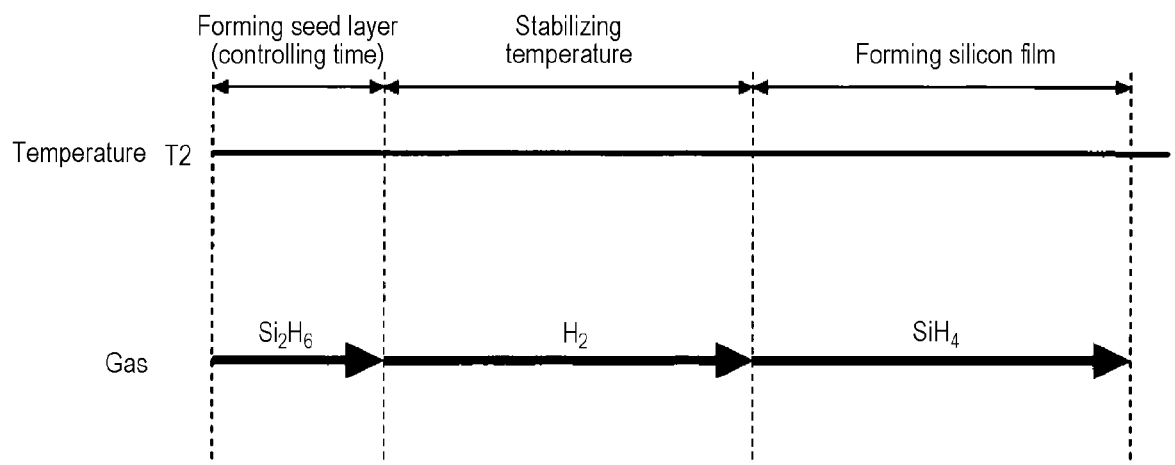
FIG. 6 is a view illustrating a modification of the method for forming a poly silicon film of the second embodiment.

Further, although it has been described in the above example that the seed layer forming process and the silicon film forming process are executed at different temperatures, the present disclosure is not limited thereto. For example, as illustrated in FIG. 6, the seed layer forming process and the silicon film forming process may be executed at the same temperature (for example, the second temperature T2). In this case, the temperature increasing process may be omitted. Further, FIG. 6 is a view illustrating a modification of the method for forming a poly silicon film of the second embodiment.

Next, the reason that the grain size of the poly silicon film can be controlled through the method for forming the poly silicon film will be described.

First, a seed layer on a substrate, which is accommodated in the interior of a processing container, is formed by supplying the silicon raw material gas for the seed layer to the substrate for a period of time according to a desired grain size in the seed layer forming process. In the seed layer forming process, the formation of the crystal nuclei is suppressed if the seed layer becomes a perfect film that covers the entire surface of the substrate by increasing the process time, but it becomes easier to form crystal nuclei if the seed layer becomes an imperfect film by decreasing the process time. In the temperature increasing process and the temperature stabilizing process, in order to stabilize the temperature of the substrate by heating the substrate in the hydrogen atmosphere, desorption of hydrogen is suppressed even when the temperature of the seed layer becomes not less than a temperature at which hydrogen is desorbed from the interior of the film. In the silicon film forming process, an amorphous silicon film is formed on the seed layer, in which the crystal nuclei of Si are formed. In the crystallization process, grains grow while the crystal nuclei formed in the seed layer are taken as base points, by heat-processing the amorphous silicon film. Accordingly, as the density of the crystal nuclei increases, the grain size decreases. That is, the grain size becomes smaller as the density of the crystal nuclei increases if the period of time for the seed layer forming process decreases, and the grain size becomes larger as the density of the crystal nuclei decreases if the period of time for the seed layer forming process increases.

In this manner, in the method for forming a semiconductor film according to an embodiment, the grain size of the poly silicon film can be controlled by controlling the period of time for the seed layer forming process.

Further, although the case of forming a silicon film as the method for forming a semiconductor film has been described in the first embodiment and the second embodiment, the present disclosure is not limited thereto. The method for forming a semiconductor film, for example, may be applied to the case of forming a germanium film and a silicon germanium film. The germanium film and the silicon germanium film, for example, may be non-doped films or doped films.

When the germanium film is formed, for example, a germanium raw material gas may be used instead of the silicon raw material gas. Gas including at least any one of a hydrogenated germanium gas, a halogen-containing germanium gas, and an amino germanium-based gas may be used as the germanium raw material gas. The hydrogenated germanium gas may include, for example, $GeH_4$, $Ge_2H_6$, and $Ge_3H_8$. For example, the halogen-containing germanium gas may include a fluoride-containing germanium gas such as $GeF_4$, $GeHF_3$, $GeH_2F_2$, and $GeH_3F$, a chloride-containing germanium gas such as $GeCl_4$, $GeHCl_3$, $GeH_2Cl_2$, and $GeH_3Cl$, and a bromine-containing germanium gas such as $GeBr_4$, $GeHBr_3$, $GeH_2Br_2$, and $GeH_3Br$. The amino germanium-based gas may include, for example, dimethylamino germanium (DMAG), diethylamino germanium (DEAG), bis(dimethylamino) germanium (BDMAG), bis(deiethylamino) germanium (BDEAG), and trisdimethylamino germanium (3DMAG).

When the silicon germanium film is formed, for example, a mixture gas of the silicon raw material gas and the germanium raw material gas may be used instead of the silicon raw material gas.

[Film Forming Device]

As a film forming device that can carry out the method for forming a semiconductor film, a batch type vertical heat processing device that comprehensively performs heat processing on a plurality of substrates will be described as an example. However, the film forming device is not limited to a batch type device, but may, for example, be a single wafer processing type device that processes the substrates one by one.

Figure 7:
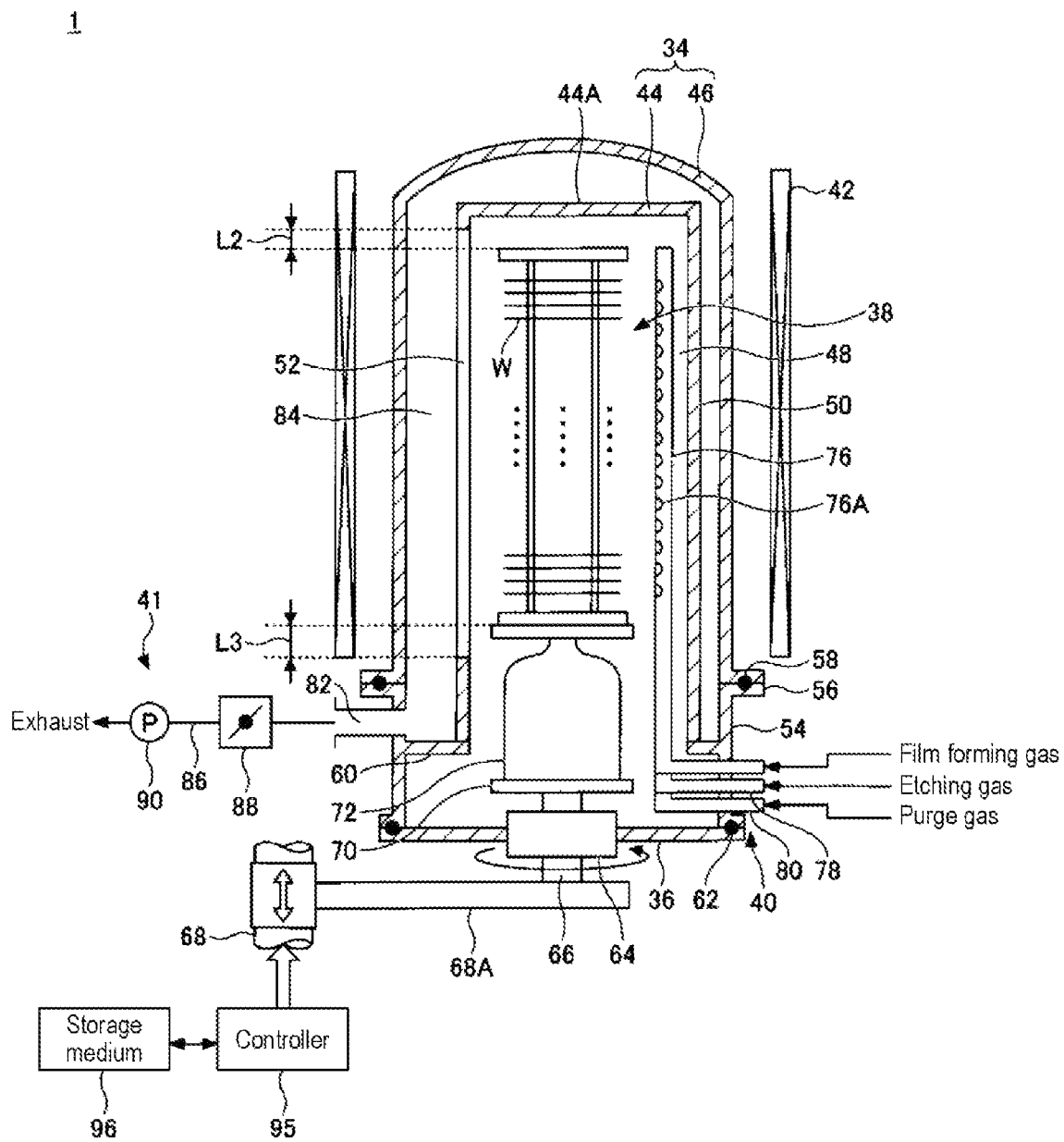
FIG. 7 is a longitudinal sectional view illustrating an example of a vertical heat processing device.
Figure 8:
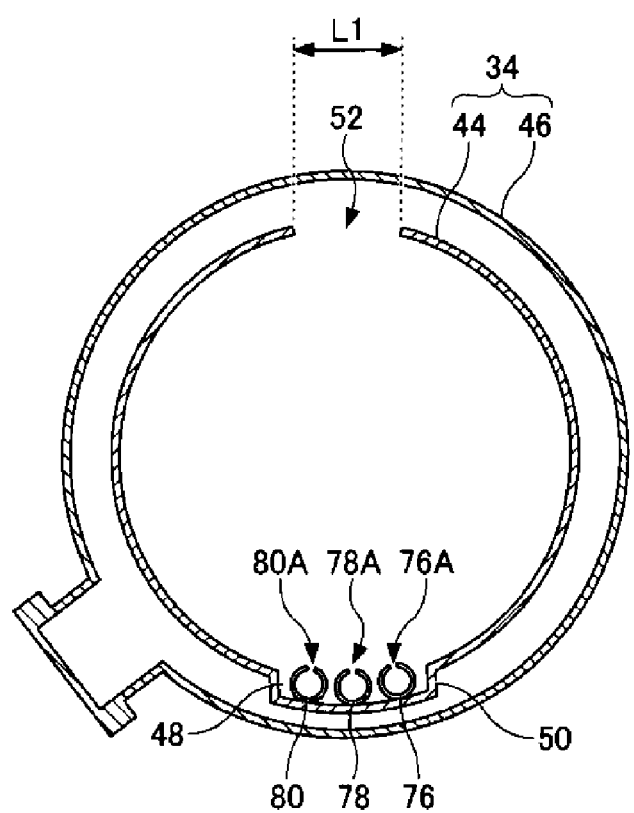
FIG. 8 is a view illustrating a reaction pipe of the vertical heat processing device of FIG. 7.

FIG. 7 is a longitudinal sectional view illustrating an example of a vertical heat processing device. FIG. 8 is a view illustrating a reaction pipe of the vertical heat processing device of FIG. 7.

As illustrated in FIG. 7, the vertical heat processing device 1 has a reaction pipe 34, a cover 36, a wafer boat 38, a gas supply 40, an exhauster 41, and a heater 42.

The reaction pipe 34 is a processing container that accommodates the wafer boat 38. The wafer boat 38 is a substrate holding tool that holds a plurality of semiconductor wafers (hereinafter, referred to as 'wafers W') at a predetermined interval. The reaction pipe 34 has a cylindrical inner pipe 44 having a ceiling, the lower end of which is opened, and a cylindrical outer pipe 46 having a ceiling, the lower end of which is opened and which covers the outside of the inner pipe 44. The inner pipe 44 and the outer pipe 46 are formed of a heat-resistant material, such as quartz, and are coaxially disposed to form a dual pipe structure.

A ceiling part 44A of the inner pipe 44, for example, is flattened. A nozzle accommodating portion 48 that accommodates a gas supply pipe along the lengthwise direction (vertical direction) thereof is formed on one side of the inner pipe 44. For example, as illustrated in FIG. 8, a convex part 50 is formed by causing a portion of a side wall of the inner pipe 44 to protrude toward the outside, and the interior of the convex part 50 is formed as a nozzle accommodating portion 48. A rectangular opening 52 having a width L1 along the lengthwise direction (vertical direction) thereof is formed on an opposite side wall of the inner pipe 44 to be opposite to the nozzle accommodating portion 48.

The opening 52 is a gas exhaustion hole formed to exhaust the gas in the inner pipe 44. The length of the opening 52 may be formed to extend vertically to be the same as the length of the wafer boat 38 or to be larger than the length of the wafer boat 38. That is, an upper end of the opening 52 is located to extend to a height that is no less than a location corresponding to an upper end of the wafer boat 38, and a lower end of the opening 52 is located to extend to a height that is no more than a location corresponding to a lower end of the wafer boat 38. In detail, as illustrated in FIG. 7, a height distance L2 between the upper end of the wafer boat 38 and the upper end of the opening 52 is within a range of about 0 mm to 5 mm. Further, the height distance L3 between the lower end of the wafer boat 38 and the lower end of the opening 52 is within a range of 0 mm to 350 mm.

The lower end of the reaction pipe 34 is supported, for example, by a cylindrical manifold 54 formed of stainless steel. A flange 56 is formed at an upper end of the manifold 54, and a lower end of the outer pipe 46 is provided on the flange 56 to be supported. A seal member 58, such as an O ring, is interposed between the flange 56 and the lower end of the outer pipe 46 to maintain the interior of the outer pipe 46 in a sealed state.

An annular support frame 60 is provided on an inner wall at an upper portion of the manifold 54, and a lower end of the inner pipe 44 is installed on the support frame 60 to be supported. The cover 36 is mounted in an opening at the lower end of the manifold 54 to be airtight by a seal member 62, such as an O-ring, and the opening at the lower end of the reaction pipe 34, that is, the opening of the manifold 54, is blocked airtight. The cover 36 is formed, for example, of stainless steel.

A rotary shaft 66 is provided at a central portion of the cover 36 to pass through a magnetic fluid seal part 64. A lower portion of the rotary shaft 66 is supported by an elevator 68 including an arm 68A and a boat elevator to be rotatable.

A rotary plate 70 is provided at an upper end of the rotary shaft 66, and the wafer boat 38 that holds the wafers W by a temperature keeping member 72 of quartz is loaded on the rotary plate 70. Accordingly, the cover 36 and the wafer boat 38 are integrally moved upwards and downwards as the elevator 68 is elevated, and the wafer boat 38 is configured to be inserted into and separated from the reaction pipe 34.

The gas supply 40 is provided in the manifold 54, and gases such as a film forming gas, an etching gas, and a purge gas are introduced into the interior of the inner pipe 44. The gas supply 40 has a plurality (for example, three) of gas supply pipes 76, 78, and 80 of quartz. The gas supply pipes 76, 78, and 80 are installed in the interior of the inner pipe 44 along the lengthwise direction thereof, and a proximal end is curved in an L shape to pass through the manifold 54 to be supported.

The gas supply pipes 76, 78, and 80, as illustrated in FIG. 8, are installed to be in line along a circumferential direction in the nozzle accommodating portion 48 of the inner pipe 44. A plurality of gas holes 76A, 78A, and 80A are formed in the gas supply pipes 76, 78, and 80 at a predetermined interval at the lengthwise directions thereof, and gases may be discharged horizontally from the gas holes 76A, 78A, and 80A. The interval is set, for example, to be the same as the interval of the wafers W supported by the wafer boat 38. Further, the locations in a height direction of the gas holes 76A, 78A, and 80A are set such that the gas holes 76A, 78A, and 80A are located in the middle of the wafers W that are adjacent to each other vertically, and the gases may be efficiently supplied to the spaces between the wafers W. The gases may include a film forming gas, an etching gas, and a purge gas, and may be supplied through the gas supply pipes 76, 78, and 80 while the flow rates of the gases are controlled.

A gas exit 82 is formed on a side wall of an upper portion of the manifold 54 and on the upper side of the support frame 60, and the gas in the inner pipe 44, which is discharged from the opening 52, may be exhausted through a space 84 between the inner pipe 44 and the outer pipe 46. The exhauster 41 is provided in the gas exit 82. The exhauster 41 has an exhaustion passage 86 connected to the gas exit 82, and a pressure adjusting valve 88 and a vacuum pump 90 are sequentially installed in the exhaustion passage 86 to vacuum the interior of the reaction pipe 34.

The cylindrical heater 42 is provided on an outer peripheral side of the outer pipe 46 to cover the outer pipe 46. The heater 42 heats the wafers W accommodated in the reaction pipe 34.

An overall operation of the vertical heat processing device 1 is controlled by the controller 95. The controller 95 may be, for example, a computer and the like. Further, a program of the computer that performs an overall operation of the vertical heat processing device 1 is stored in a storage medium 96. The storage medium 96 may be, for example, a flexible disk, a compact disk, a hard disk, a flash memory, and a DVD.

An example of the method for forming a poly silicon film on wafers W by the related vertical heat processing device 1 will be described. First, the wafer boat 38 that holds a plurality of wafers W is carried into the interior of the reaction pipe 34 by the elevator 68, and an opening at the lower end of the reaction pipe 34 is blocked and sealed by the cover 36. Subsequently, the operations of the gas supply 40, the exhauster 41, and the heater 42 are controlled by the controller 95 such that steps S11 to S16 or steps S21, S22, S23, S25, and S26, which have been described above, are executed. Accordingly, a poly silicon film, the grain size of which is controlled, is formed on the wafers W.

Embodiment 1

In embodiment 1, a result of an experiment that was performed to identify that the grain size of a poly silicon film may be controlled by controlling the period of time for the vacuuming process is described. In embodiment 1, steps S11 to S16 in the above-described method for forming a poly silicon film were performed by using the vertical heat processing device 1. In the seed layer forming process, a seed layer having a thickness of 2 nm was formed in a process condition of a processing temperature of 380 degrees C., a pressure of 1 Torr (133 Pa), and a silicon raw material gas for a seed layer of $Si_2H_6$. Further, in the silicon film forming process, an amorphous silicon film having a thickness of 28 nm was formed in a process condition of a processing temperature of 470 degrees C., a pressure of 0.4 Torr (53 Pa), and a silicon raw material gas of $SiH_4$. Further, the periods of time for the vacuuming process were changed to 0 minutes, 5 minutes, and 60 minutes. Further, the grain sizes of the poly silicon film formed thereby were evaluated by an electron back scatter diffraction pattern (EBSD) method.

In the evaluation result, the average values of the grain sizes of the poly silicon film when the periods of time for the vacuuming process were 0 minutes, 5 minutes, and 60 minutes were 0.35 µm, 0.31 µm, and 0.29 µm, respectively. It can be seen from the result that the grain size of the poly silicon film is changed by changing the period of time for the vacuuming process. In more detail, it can be seen that the grain size of the poly silicon film becomes smaller as the period of time for the vacuuming process increases. It can be seen that the grain size of the poly silicon film can be controlled by controlling the period of time for the vacuuming process.

Embodiment 2

In embodiment 2, a result of an experiment that was performed to identify that the grain size of a poly silicon film may be controlled by controlling the period of time for the seed layer forming process is described. In embodiment 2, steps S21, S22, S23, S25, and S26 in the above-described method for forming a poly silicon film were performed by using the vertical heat processing device 1. In the seed layer forming process, a first seed layer having a thickness of 1 nm was formed in a process condition of a processing temperature of 350 degrees C., a pressure of 1 Torr (133 Pa), and a silicon raw material gas for a seed layer of an amino silane-based gas. Further, a second seed layer was formed on the first seed layer in a process condition of a processing temperature of 350 degrees C., a pressure of 4 Torr (533 Pa), and a silicon raw material gas for a seed layer of $Si_2H_6$. Then, the periods of time for forming the second seed layer were changed to 0 minutes, 50 minutes, and 150 minutes. Further, in the silicon film forming process, an amorphous silicon film having a thickness of 28 nm doped with phosphorous was formed in a process condition of a processing temperature of 520 degrees C., a pressure of 0.3 Torr (40 Pa), and a silicon raw material gas of $SiH_4$. Further, the grain sizes of the poly silicon film formed thereby were evaluated by the EBSD method.

Figure 9:
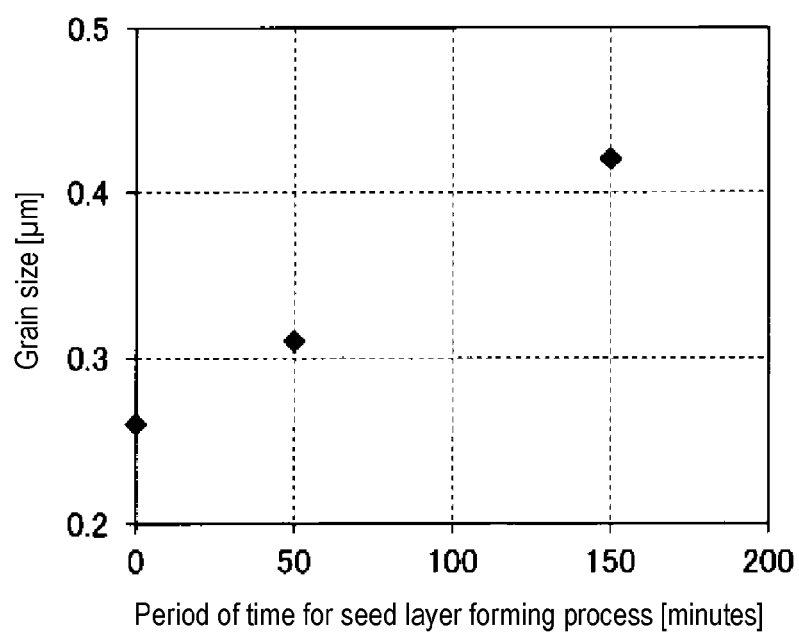
FIG. 9 is a view illustrating a relationship between a time period for a seed layer forming process and a grain size of a poly silicon film.

FIG. 9 is a view illustrating a relationship between a time period for a seed layer forming process and a grain size of a poly silicon film. As illustrated in FIG. 9, the average values of the grain sizes of the poly silicon film were 0.26 µm, 0.31 m, and 0.42 m, when the periods of time for the seed layer forming process were 0 minutes, 50 minutes, and 150 minutes, respectively. It can be seen from the result that the grain size of the poly silicon film is changed by changing the period of time for the seed layer forming process. In more detail, it can be seen that the grain size of the poly silicon film becomes larger as the period of time for the seed layer forming process increases. It can be seen that the grain size of the poly silicon film can be controlled by controlling the period of time for the seed layer forming process.

The disclosed embodiment should be considered to be illustrative in all aspects and not restrictive. Omissions, replacements, and modifications may be made in various forms without departing from the scope and purpose of the attached claims.

According to the present disclosure, a crystallized semiconductor film, the grain size of which is controlled without being doped with impurities, can be formed.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a crystallized semiconductor film having a specific grain size on a substrate, comprising:
   forming a seed layer on the substrate accommodated in a processing container;
   vacuuming an interior of the processing container to a medium vacuum or less in a state in which the substrate, on which the seed layer is formed, is accommodated in the processing container;
   forming an amorphous semiconductor film on the seed layer after vacuuming the interior of the processing container; and
   crystallizing the amorphous semiconductor film by heat processing,
   wherein vacuuming the interior of the processing container comprises exhausting a gas from the interior of the processing container, and
   wherein vacuuming the interior of the processing container is performed for a time period associated with the specific grain size.

2. The method of claim 1, wherein vacuuming the interior of the processing container is performed without supplying a gas to the interior of the processing container.

3. The method of claim 1, further comprising:
   increasing a temperature of the substrate from a first temperature to a second temperature that is higher than the first temperature in a hydrogen atmosphere after forming the seed layer; and
   stabilizing the temperature of the substrate in the hydrogen atmosphere after increasing the temperature of the substrate to the second temperature,
   wherein vacuuming the interior of the processing container is performed after stabilizing the temperature of the substrate.

4. The method of claim 1, wherein vacuuming the interior of the processing container is performed without supplying a gas to the interior of the processing container.

5. The method of claim 1, wherein forming the seed layer comprises supplying a gas including at least one selected from the group consisting of a higher-order silane-based gas including two or more Si atoms in one molecule, an amino silane-based gas, and a mixture gas of a hydrogenated silane gas and a halogen-containing silicon gas to the substrate, and
   wherein forming the amorphous semiconductor film comprises supplying a silicon raw material gas to the substrate.

6. The method of claim 1, wherein the amorphous semiconductor film is an amorphous silicon film.

7. A method for forming a crystallized semiconductor film having a specific grain size on a substrate, comprising:
   forming a seed layer on the substrate by supplying a raw material gas for the seed layer to the substrate accommodated in a processing container for a time period associated with the specific grain size;
   forming an amorphous semiconductor film on the seed layer;
   crystallizing the amorphous semiconductor film by heat processing;
   increasing a temperature of the substrate from a first temperature to a second temperature that is higher than the first temperature in a hydrogen atmosphere after forming the seed layer; and
   stabilizing the temperature of the substrate in the hydrogen atmosphere after increasing the temperature of the substrate to the second temperature.

8. The method of claim 7, wherein forming the seed layer comprises supplying a gas including at least one selected from the group consisting of a higher-order silane-based gas including two or more Si atoms in one molecule, an amino silane-based gas, and a mixture gas of a hydrogenated silane gas and a halogen-containing silicon gas to the substrate, and
   wherein forming the amorphous semiconductor film comprises supplying a silicon raw material gas to the substrate.

9. The method of claim 7, wherein the amorphous semiconductor film is an amorphous silicon film.

10. A film forming device for forming a crystallized semiconductor film having a specific grain size on a substrate, comprising:
    a processing container in which the substrate is accommodated;
    a gas supply configured to supply a gas to an interior of the processing container;
    an exhauster configured to exhaust a gas from the interior of the processing container;
    a heater configured to heat the substrate; and
    a controller,
    wherein the controller controls the supply, the exhauster, and the heater to execute operations of:
    forming a seed layer on the substrate accommodated in the processing container;
    vacuuming an interior of the processing container to a medium vacuum or less in a state in which the substrate, on which the seed layer is formed, is accommodated in the processing container;
    forming an amorphous semiconductor film on the seed layer after vacuuming the interior of the processing container; and
    crystallizing the amorphous semiconductor film by heat processing,
    wherein vacuuming the interior of the processing container comprises exhausting a gas from the interior of the processing container, and
    wherein vacuuming the interior of the processing container is performed for a time period associated with the specific grain size.

* * * * *